United States Patent [19]

Martin

[11] Patent Number: 4,975,650
[45] Date of Patent: Dec. 4, 1990

[54] PHASE DETECTOR

[75] Inventor: Frederick L. Martin, North Lauderdale, Fla.

[73] Assignee: Motorola, Inc., Schaumburg, Ill.

[21] Appl. No.: 384,355

[22] Filed: Jul. 24, 1989

[51] Int. Cl.$^5$ .................. H03D 13/00; H03K 9/06; H03L 7/00

[52] U.S. Cl. .................. 328/133; 328/155; 307/511

[58] Field of Search .................. 328/133, 134, 155; 307/511, 514, 262; 331/1 A

[56] References Cited

U.S. PATENT DOCUMENTS

| | | | |
|---|---|---|---|
| 3,667,031 | 5/1972 | Cox | 328/155 |
| 3,983,506 | 9/1976 | Rettinger | 328/155 |
| 4,499,425 | 12/1985 | Maas | 328/134 |
| 4,764,737 | 8/1988 | Kaatz | 331/1 A |
| 4,816,774 | 3/1989 | Martin | 331/1 A |

Primary Examiner—Stanley D. Miller
Attorney, Agent, or Firm—Daniel K. Nichols

[57] ABSTRACT

A phase detector is provided for detecting the phase difference between a first input signal and a second input signal and providing an output corresponding thereto. The phase detector comprises a dual state phase detector, a tri-state phase detector, a control input for receiving a control signal, and a control circuit for selecting either the dual state phase detector or tri-state phase detector. The dual state phase detector compares the phase difference between the first input signal and the second input signal. The tri-state phase detector compares the phase difference between the second input signal and the inverse of the first input signal. The control circuit selects the output of the dual state phase detector or selects the output of the tri-state phase detector based upon the control signal.

11 Claims, 3 Drawing Sheets

PHASE DETECTOR

TECHNICAL FIELD

This invention relates generally to the field of phase detectors and, particularly to a phase detector which includes both a dual state and a tri-state phase detectors cells.

BACKGROUND ART

Frequency synthesizers having phase lock loops (PLL) are widely utilized in electronic systems. Particularly, in communication systems frequency synthesizers provide an advantage in reducing the circuitry required to transmit and receive signals on different frequencies. Such digital phase lock loops are well known in the art. Digital PLLs may be used for generating a number of frequencies from a reference frequency, by simply changing a dividing factor.

A significant parameter when considering a synthesizer system is its lock time. The lock time is the amount of time elapsed before the PLL reaches steady state after being switched from one frequency to another frequency. A PLL having a wider loop bandwidth generally provides faster lock time. The frequency resolution of the PLL is another important parameter to consider, and is determined by the reference frequency in systems having an integer divider. For example a 5 KHz reference frequency provides a 5 KHz frequency resolution per divider step. If the reference frequency is increased, it is generally possible to increase the bandwidth of the phase lock loop. However, increasing the reference frequency produces a more coarse resolution for the PLL. In order to achieve finer resolution, fractional dividers can be used in the feedback of the loop. The fractional dividers, however, produce low frequency spurs, when dividing the output of a voltage controlled oscillator (VCO). Spurs appear as FM sidebands on the VCO output. These low frequency spurs may be reduced in the fractional divider itself. A frequency synthesizer with spur compensation is disclosed in my U.S. Pat. No. 4,816,774, the disclosure of which is hereby incorporated by reference. However, in order to mitigate the regeneration of these low frequency spurs, a phase detector having a linear transfer characteristics is necessary. Additionally, in some applications where fractional dividers are used, the narrow lock range of the PLL and the frequency range within which the PLL must operate makes frequency steering a necessity.

A digital phase detector comprises an integral part of a digital phase lock loop system. The digital phase detector provides an output, which is characterized by the phase difference between a first reference frequency signal and a second divided VCO signal. The use of dual state phase detectors or tri-state phase detectors in digital PLLs is well known.

A tri-state phase detector provides an output that has three conditions corresponding to a positive phase difference, a negative phase difference and a zero phase difference between the first and second input signals. The tri-state phase detector provides frequency steering. However, a tri-state phase detector does not provide the necessary linearity in the phase difference detecting range. Adaptive tri-state systems, where the output current is increased in the adapt mode to facilitate rapid frequency steering, are known.

A dual state phase detector provides an output having a duty cycle which is characterized by the phase difference between the first and second input signals. When the first and the second input signals are equal in frequency and 180 degrees out of phase, a 50% duty cycle at the output is provided. In practice the duty cycle of the output of the phase detector can be converted to a physical parameter such as current. Generally, a dual state phase detector acts linearly within a phase difference detecting range of 360 degrees. A major disadvantage of a dual state phase detector is its inability to steer the frequency in the correct direction. Accordingly, since the phase detector skips detection of a full cycle on one of the input signals, a "cycle skip" occurs. Therefor, it is desired to provide a linear phase detector having frequency steering capability.

SUMMARY OF THE INVENTION

Accordingly, it is the object of the present invention to provide a phase detector which utilizes a dual state phase detector and has frequency steering capability.

Briefly, according to the invention, a phase detector is provided for detecting the phase difference between a first input signal and a second input signal and providing an output corresponding thereto.

The phase detector of the invention comprises a dual state phase detector, a tri-state phase detector, a control input for receiving a control signal, and a control system responsive to the dual state and tri-state phase detectors. The dual state phase detector detects the phase difference between the first input signal and the second input signal. The tri-state phase detector compares the phase difference between the second input signal and the inverse of the first input signal. The control system selects the output of the dual state phase detector when activated by a signal to the control input, and selects the output of the tri-state phase detector when activated by a signal to control input.

DETAILED DESCRIPTION OF THE PREFERRED EMBODIMENT

Figure 1:
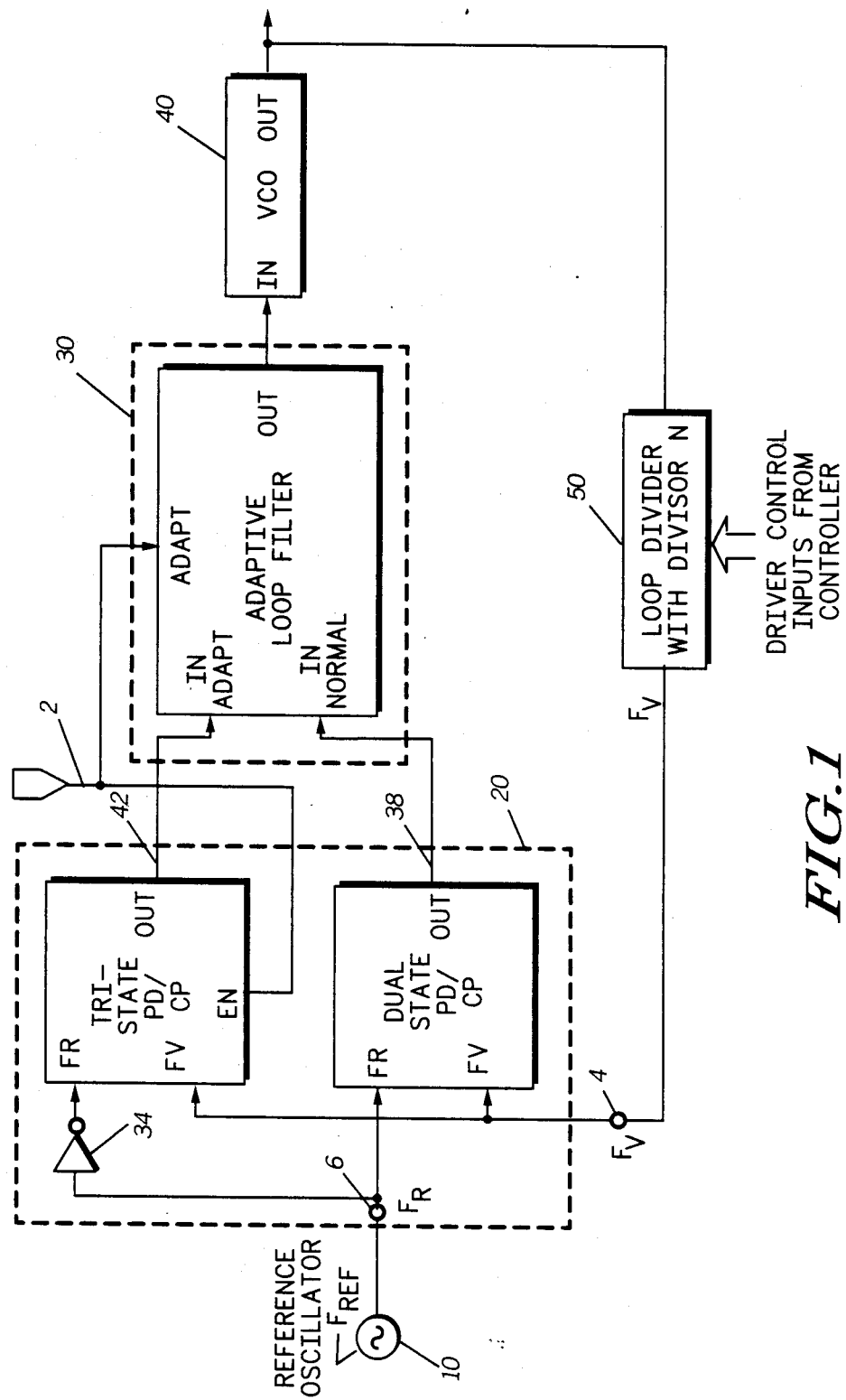
FIG. 1 is a block diagram a phase lock loop utilizing a phase detector in accordance with the present invention.

Referring to FIG. 1, a schematic diagram of a phase lock loop utilizing the preferred phase detector is shown. The phase lock loop functions to maintain the frequency of a voltage control oscillator (VCO) 40 output frequency at a desired point. The VCO 40 is controlled by a current source in a phase detector 20 which has its outputs connected to the input of the adaptive loop filter 30. Adaptive loop filter 30 is a transimpedance type, in which current is received at the input port and voltage is provided at the output port. The current sources of the phase detector vary the voltage in the adaptive loop filter 30 by sourcing or sinking current. The output voltage of the adaptive loop filter 30 is connected to the input of the VCO 40. The VCO 40 is an oscillator whose output frequency is responsive to the input voltage from the adaptive loop filter 30.

The output of the VCO 40 is applied to a loop divider 50. The divided output of the loop divider 50, $F_v$, is applied to the phase detector 20. The output signal of a reference oscillator 10, $F_R$ is also applied to the phase detector. The phase lock loop maintains $F_v$ in phase with $F_R$ by producing a signal at the phase detector output which manipulates the VCO 40 to correct for differences between $F_v$ and $F_R$.

Figure 2:
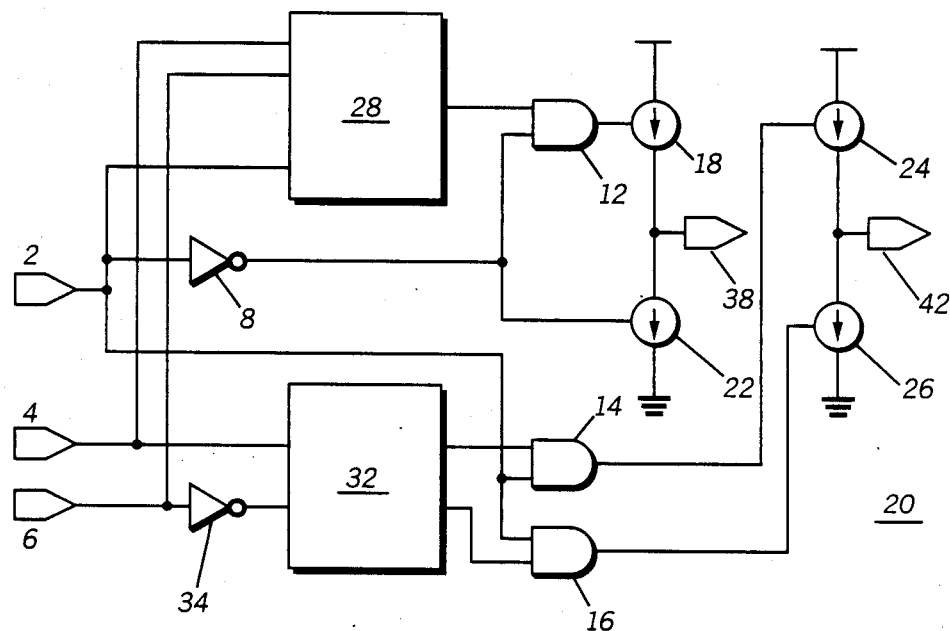
FIG. 2 is a schematic diagram of the phased detector of FIG. 1.

Referring to FIG. 2, a preferred phase detector 20 is shown. During the normal mode of operation for the phase lock loop, shown in FIG. 1, a dual state phase detector 28 is used to compare the difference between the VCO frequency and the reference frequency and provide a corresponding output 38. While the use of a single dual state phase detector 28 has been described, if desired to provide frequency steering of the dual state phase detector, on arrangement such as illustrated in my copending U.S. patent application Ser. No. 357,912, filed May 30, 1989, can be utilized. This application utilizes two dual state devices to provide extended range, the application is hereby incorporated by reference. However, when a need arises for the fast change of the characteristics of the phase lock loop, a conventional tri-state phase detector cell 32, with an inverter 34 connected to its reference input port, is used to compare the difference between the VCO frequency and reference frequency and provide the corresponding output 42. The tri-state phase detector cell 32 is designed to provide a higher output current than the dual state phase detector 28. This allows the phase detector 20, when necessary, to steer more rapidly. Rapid steering is achieved, by increasing the current provided to or from the phase detector 20 to the adaptive loop filter 30, resulting in the filter charging or discharging voltage at a more rapid rate. A tri-state phase detector cell is disclosed in U.S. Pat. No. 4,764,737, issue Aug. 16, 1988, that provides rapid steering, the patent is hereby incorporated by reference. A control means selects the output of either the dual state phase detector cell 28 or the output of the tri-state phase detector cell 32, depending on the needs of the phase lock loop. An external source, usually a microprocessor, provides an input signal to the control input 2 that activates the control means.

The control means includes: a control input 2, an inverter 8, and AND gates 12, 14, and 16. The control means acts to disable one of the phase detectors 28 or 32 which is not in use during a particular mode of operation. The output includes: a current source 18, a current sink 22, a current source 24, and a current sink 26. The output current sources of the dual state phase detector are 18 and 22. One of dual state phase detector output current sources has a fixed current of value I/2 and the other current source has a switched current of value I. The two current sources are arranged in a pair in which one is a source and the other is a sink. When the dual state phase detector cell is at steady state, the inputs 4 and 6 are of equal frequency and 180° phase offset. Current source 18 is on 50% of the time and the net charge transfer at output 38 is zero over one cycle. The output 42 of the tri-state detector cells is provided by current sources 24 and 26. When on, the output 42 of current sources 24 and 26 is higher than the output 38 of the dual state phase detector 28, provided by current sources 18 and 22. This allows the tri-state phase detector to provide rapid steering in the PLL.

Assuming the inverter 8 receives a high logic signal from the control input 2, a logic low signal is provided from the inverter 8 and received by one of the input ports of the AND gate 12. If the "up" port of the dual state phase detector cell 28 provides a logic high signal that is received by the other input port of the AND gate 12, then the AND gate 12 does not provide a logic high signal to activate the active high current source 18. Current source 18 is unable to provide current to output 38. In addition, the logic low signal provided by the inverter 8 not does activate the current sink 22, therefor, the output of the dual state phase detector cell 28 is disabled. Conversely, assuming the inverter 8 receives a low logic signal from the control input 2, a logic high signal is provided from the inverter 8 and received by one of the input ports of the AND gate 12. If the "up" port of the dual state phase detector cell 28 provides a logic high signal that is received by the other input port of the AND gate 12, then the AND gate 12 provides a logic signal to activate the current source 18. Current source 18 provides a current to output 38. Current source 22 is enabled.

Assuming control input 2 receives a logic high signal, a 1 logic high signal is provided to one of the input ports of the AND gate 14. If the "down" port of the tri-state phase detector cell 32 provides a logic low signal that is received by the other input port of the AND gate 14, then the AND gate 14 does not provide a logic signal to activate the current sink 26. If the "down" port of the tri-state phase detector cell 32 is high, current sink 26 is enabled. Conversely, assuming control input 2 receives a logic low signal, a logic low signal is received by one of the input ports of the AND gate 14. If the control input 2 receives a logic low signal, current sink 26 is off whether the "down" port of the tri-state phase detector is high or low.

Assuming control input 2 receives a logic high signal, a logic high signal is received by one of the input ports of the AND gate 16. If the "up" port of the tri-state phase detector cell 32 provides a logic high signal that is received by the other input port of the AND gate 16, then the AND gate 16 provides a logic high signal to activate the active high current source 24. The current source 24 provide current to the output 42. Conversely, assuming control input 2 receives a logic low signal, a logic low signal is received by one of the input ports of the AND gate 16. If the "up" port of the tri-state phase detector cell 32 provides a logic high signal that is received by the other input port of the AND gate 16, then the AND gate 16 does not provide the logic signal to activated the current source 24. The current source 24 does not provide a current to output 42. Therefor, when the control input 2 receives a low signal, the tri-state output current sources are disabled.

Figure 3:
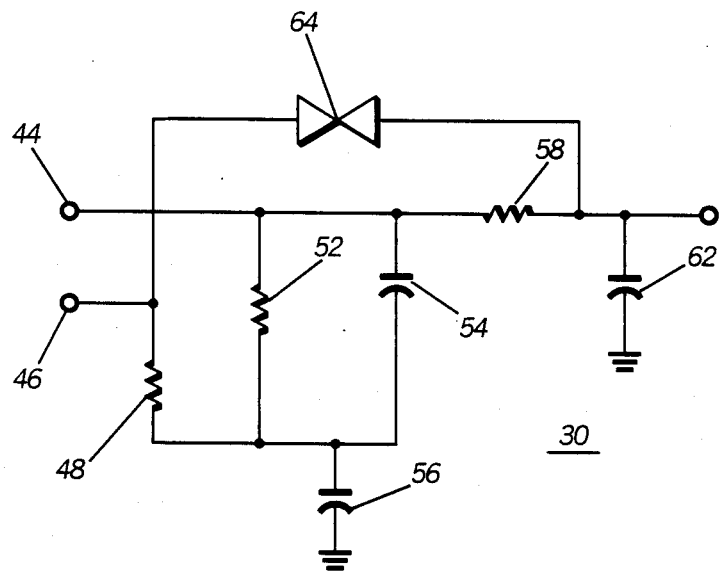
FIG. 3 is a schematic diagram of the adaptive loop filter of FIG. 1.

Referring to FIG. 3, a schematic diagram of the adaptive loop filter 30 is shown. An input 44 is connected to the output 38 of the phase detector while input 46 is connected to the output 42. A gate 64, controlled by the adapt signal of input 2, is used to switch the input 46 directly to the output of the loop filter and thereby directly charge output capacitor 62. A resistor 48 couples input 46 to a capacitor 56. Input 44 is coupled in a conventional manner by parallel connected resistor 52 and capacitor 54 to capacitor 56, and by resistor 58 to the filter output. In normal practice, capacitor 62 is much smaller in size than capacitor 56. Therefore, capacitor 56 is the primary storage element in the adaptive loop filter 30. The charged stored across capacitor 56 is the steady state voltage used to set the VCO frequency.

Figure 4:
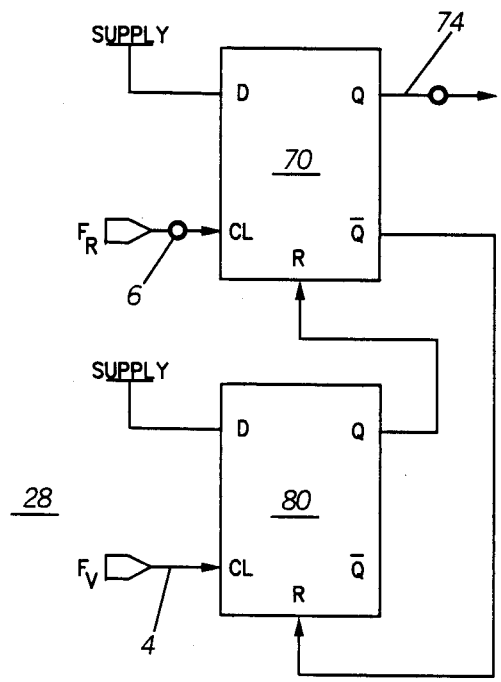
FIG. 4 is a schematic diagram of the dual state phase detector cell of FIG. 2.

Referring to FIG. 4, a preferred dual state phase detector cell 28 is shown. The dual state phase detector cell 28 comprises D flip-flops 70 and 80. In the preferred embodiment of the invention, the flip-flops 70 and 80 are edge triggered flip-flops, and respond to a leading edge transition at their clock (CLK) input. A logic high or a logic low in the preferred embodiment may be any suitable voltage potential, such as +5 V for a logic high and 0 V for a logic low. A logic high at the reset (R) input will provide a logic low at the Q output and a logic high at the $Q_{bar}$ output of the flip-flops. A first digital signal 6, which may be a reference frequency signal for a PLL circuit is received at $F_R$, and is applied to the clock inputs of the flip-flop 70. A second digital signal 4, which may be a divided down VCO signal, is received at $F_v$, and is applied to the clock inputs of the flip-flop 80. The D inputs of the flip-flop 70 and 80 coupled to a logic high.

Operation of of the dual state phase detector cell 28 may be best understood by assuming that the phase difference between the leading edge of the first input signal 6 and the second input signal 4 is less than 360 degrees, and that the leading edge of the first signal 6 occurs before the leading edge of the second signal 4. Under this condition, the second signal 4 has only one leading edge occurring within one cycle of the first signal 6. In this case, the leading edge of the first signal 6 forces the Q output 74 of the flip-flop 70 to a logic high. The $Q_{bar}$ output of flip-flop 70 presents a logic low to the reset input of flip-flop 80. Upon the occurrence of the leading edge of the second signal 4, a logic high on the Q output of the flip-flop 80 resets the flip-flop 70 and forces the output 74 to a logic low. Accordingly, the duty cycle of the output 74 which is the "up" signal to AND gate 12, is proportional to the phase difference between the first and second signals. Moreover, a logic high on the $Q_{bar}$ output of the flip-flop 70 resets the flip-flop 80 forcing the Q output of this flip-flop to a logic low. The logic low on the Q output of the flip-flop 80 allows the flip-flop 70 to be responsive to the subsequent leading edge of the first signal 6. This configuration allows the dual state phase detector 28 to be responsive to the leading edge transition, and not to be affected by the pulse width of the first and second input signals 6 and 4.

While the use of a single dual state phase detector 28 has been described, if desired to provide frequency steering of the dual state phase detector, on arrangement such as illustrated in my copending U.S. application Ser. No. 357,912, filed May 30, 1989, can be utilized. This application utilizes two dual state devices to provide extended range, the application is hereby incorporated by reference.

What is claimed is:

1. A phase detector for detecting the phase difference between a first input signal and a second input signal, and providing an output signal comprising:
    a dual state phase detector receiving said first input signal and said second input signal, and providing an output signal;
    a tri-state phase detector receiving said first input signal and said second input signal, and providing an output signal;
    a control input for receiving a control signal; and
    a control means responsive to said control signal input for selectively actuating either said dual state phase detector or said tri-state detector to provide said output signal.

2. A phase detector as defined in claim 1, in which said dual state phase detector includes a current source means and a current sink means for providing said output signal.

3. A phase detector as defined in claim 2, in which one of said current source and current sink means is operative continuously, while the other is operated intermittently.

4. A phase detector as defined in claim 3, in which said other of said current source and current sink has an output substantially twice that of said one.

5. A phase detector as defined in claim 1, in which said tri-state phase detector include at least one current source and one current sink for providing an output signal.

6. A phase detector as defined in claim 1, in which said control input includes at least one inverter for providing an inverted control signal.

7. The phase detector of claim 1, wherein the magnitude of said output signal of said tri-state phase detector cell is higher than the magnitude of said output signal of said dual state phase detector cell.

8. A phase detector as defined in claim 6, wherein said dual state and said tri-state phase detector means are edge triggered.

9. a phase detector as defined in claim 1, wherein a means for inverting said first input signal provides an inverse of said first input signal to said tri-state phase detector cell.

10. The phase detector of claim 9, in which said means for inverting said first input signal is a binary inverter.

11. The phase detector of claim 1, in which said first input signal has a substantially 50% duty cycle.

* * * * *